(12) United States Patent
Kraut et al.

(10) Patent No.: US 7,881,401 B2
(45) Date of Patent: Feb. 1, 2011

(54) TRANSMITTER ARRANGEMENT AND SIGNAL PROCESSING METHOD

(75) Inventors: Gunther Kraut, Egmating (DE); Junqi Liu, München (DE); Qi Yu, München (DE)

(73) Assignee: Infineon Technologies AG, Neubiberg (DE)

( * ) Notice: Subject to any disclaimer, the term of this patent is extended or adjusted under 35 U.S.C. 154(b) by 902 days.

(21) Appl. No.: 11/601,226

(22) Filed: Nov. 17, 2006

(65) Prior Publication Data

US 2008/0118000 A1 May 22, 2008

(51) Int. Cl.
*H04L 25/49* (2006.01)
*H04K 1/02* (2006.01)

(52) U.S. Cl. .................. 375/296; 375/297; 375/308; 375/135; 375/146; 375/142; 375/358

(58) Field of Classification Search .................. 375/296
See application file for complete search history.

(56) References Cited

U.S. PATENT DOCUMENTS

| | | | |
|---|---|---|---|
| 5,012,200 A | | 4/1991 | Meinzer |
| 5,093,636 A | * | 3/1992 | Higgins et al. ............... 332/100 |
| 5,264,807 A | * | 11/1993 | Okubo et al. ............... 330/295 |
| 5,287,069 A | * | 2/1994 | Okubo et al. .................. 330/10 |
| 5,345,189 A | * | 9/1994 | Hornak et al. .......... 330/207 A |
| 5,365,187 A | | 11/1994 | Hornak et al. |
| 5,621,351 A | | 4/1997 | Puri et al. |
| 5,901,346 A | | 5/1999 | Stengel et al. |
| 5,939,951 A | * | 8/1999 | Bateman et al. ............. 332/103 |
| 5,973,559 A | * | 10/1999 | Alberty .................. 330/124 R |
| 6,049,255 A | * | 4/2000 | Hagberg et al. ............... 331/17 |
| 6,054,894 A | * | 4/2000 | Wright et al. ............... 330/149 |

(Continued)

FOREIGN PATENT DOCUMENTS

JP 2003-298357 A 10/2003

(Continued)

OTHER PUBLICATIONS

"Technical Examination of Outphasing Amplifier Systems for Transmitting Amplitude Modulated Signals According to the GSM/EDGE and the UMTS Standard", Qi Yu, Master Thesis available at the internal library of the Institute of Radio Frequency and Microwave Engineering at the University of Hanover, Date Not Available, 91 pgs.

(Continued)

*Primary Examiner*—Chieh M Fan
*Assistant Examiner*—Santiago Garcia
(74) *Attorney, Agent, or Firm*—Eschweiler & Associates, LLC

(57) ABSTRACT

A transmitter arrangement includes a first and a second phase-locked loop, each having a power amplifier. The first phase-locked loop generates a first amplified oscillator signal depending on a first input signal representing a first phase information, wherein a first feedback signal for the first phase-locked loop is derived from the first amplified oscillator signal. Accordingly, the second phase-locked loop generates a second amplified oscillator signal depending on a second input signal representing a second phase information. A second feedback signal for the second phase-locked loop is derived from the second amplified oscillator signal. The transmitter arrangement further includes a summation element to combine the amplified first oscillator signal and the amplified second oscillator signal to an output signal.

30 Claims, 5 Drawing Sheets

U.S. PATENT DOCUMENTS

| | | | |
|---|---|---|---|
| 6,054,896 A * | 4/2000 | Wright et al. | 330/149 |
| 6,133,788 A | 10/2000 | Dent | |
| 6,201,452 B1 * | 3/2001 | Dent et al. | 332/103 |
| 6,369,651 B1 * | 4/2002 | Dent | 330/127 |
| 6,587,511 B2 * | 7/2003 | Barak et al. | 375/295 |
| 6,593,827 B2 * | 7/2003 | Chethik et al. | 332/103 |
| 6,690,233 B2 * | 2/2004 | Sander | 330/124 R |
| 6,737,914 B2 * | 5/2004 | Gu | 330/2 |
| 6,799,020 B1 * | 9/2004 | Heidmann et al. | 455/103 |
| 6,836,183 B2 | 12/2004 | Wight | |
| 6,879,209 B2 | 4/2005 | Grundlingh | |
| 6,889,034 B1 | 5/2005 | Dent | |
| 6,930,547 B2 | 8/2005 | Chandrasekaran et al. | |
| 7,184,723 B2 * | 2/2007 | Sorrells et al. | 455/127.3 |
| 7,184,728 B2 * | 2/2007 | Solum | 455/234.1 |
| 7,236,753 B2 * | 6/2007 | Zipper | 455/102 |
| 7,343,138 B2 * | 3/2008 | Bengtson et al. | 455/103 |
| 7,409,010 B2 * | 8/2008 | McHenry | 375/296 |
| 7,421,036 B2 * | 9/2008 | Sorrells et al. | 375/294 |
| 7,469,017 B2 * | 12/2008 | Granstrom et al. | 375/295 |
| 7,505,747 B2 * | 3/2009 | Solum | 455/234.1 |
| 7,555,059 B2 * | 6/2009 | Rybicki et al. | 375/297 |
| 7,558,546 B2 * | 7/2009 | Johnson et al. | 455/182.3 |
| 2001/0010713 A1 | 8/2001 | Yamamoto | |
| 2002/0027958 A1 * | 3/2002 | Kolanek | 375/297 |
| 2002/0047745 A1 | 4/2002 | Kolanek | |
| 2003/0125056 A1 | 7/2003 | Jiang | |
| 2003/0125065 A1 * | 7/2003 | Barak et al. | 455/522 |
| 2004/0185805 A1 * | 9/2004 | Kim et al. | 455/114.3 |
| 2004/0204100 A1 * | 10/2004 | Braithwaite | 455/561 |
| 2004/0266368 A1 * | 12/2004 | Rosnell | 455/110 |
| 2005/0007194 A1 | 1/2005 | Grundlingh | |
| 2005/0018787 A1 | 1/2005 | Saed | |
| 2005/0073374 A1 | 4/2005 | Korol | |
| 2005/0110590 A1 * | 5/2005 | Korol | 332/149 |
| 2005/0136864 A1 * | 6/2005 | Zipper | 455/127.1 |
| 2005/0148307 A1 * | 7/2005 | Zipper | 455/102 |
| 2005/0195031 A1 * | 9/2005 | Grundlingh | 330/251 |
| 2005/0215206 A1 * | 9/2005 | Granstrom et al. | 455/102 |
| 2005/0275481 A1 * | 12/2005 | Grewing et al. | 332/127 |

FOREIGN PATENT DOCUMENTS

| | | |
|---|---|---|
| JP | 2003-298361 A | 10/2003 |
| JP | 2004-260707 A | 9/2004 |
| WO | 2004019479 A | 3/2004 |

OTHER PUBLICATIONS

Rosnell S., et al.; "Bandpass Pulse-Width Modulation (BP-PWM)"; 2005 IEEE MTT-S International Microwave Symposium; Piscataway, NJ; Jun. 12, 2005, pp. 731-734.

European Search Report issued to EP Application No. 07118850.2-2215/1923991 on Dec. 14, 2009, pp. 1-8.

* cited by examiner

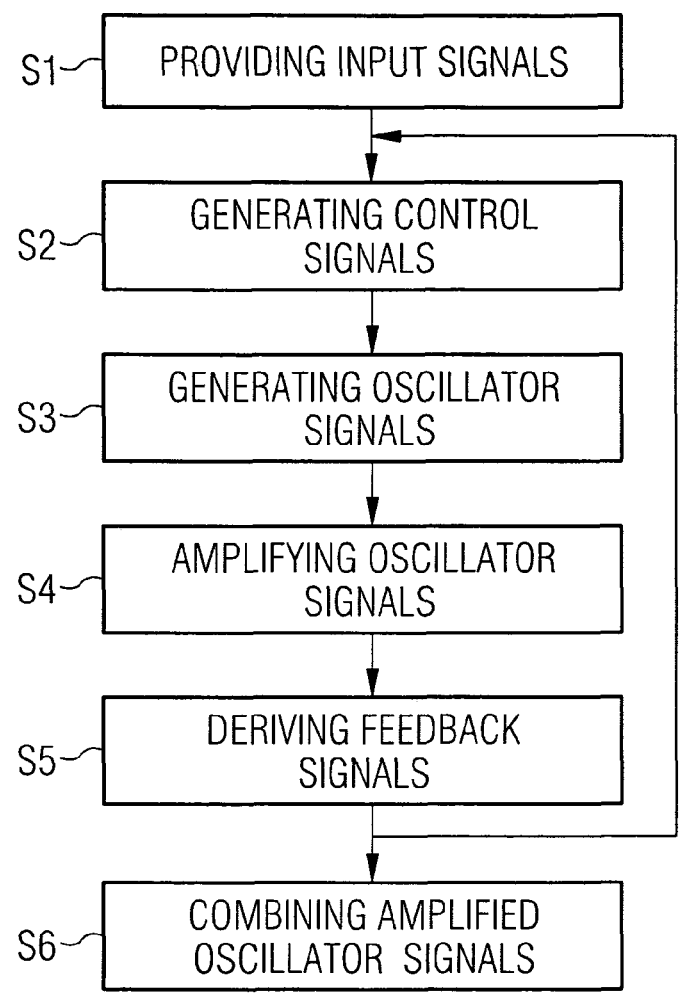

TRANSMITTER ARRANGEMENT AND SIGNAL PROCESSING METHOD

BACKGROUND OF THE INVENTION

The requirements for the signal quality of modulators, for example in transmitting devices, become more stringent as the need for high data rates and increasing mobility grows. The modern mobile radio standards, such as Universal Mobile Telecommunications System (UMTS), Wideband Code Division Multiple Access (WCDMA), Global System for Mobile Communication (GSM), Enhanced Data Rates for GSM Evolution (EDGE), Bluetooth Medium Data Rate or Wireless Local Area Network (WLAN) according to 802.11*a/b/g* require special modulation types for data transmission which modulate both the phase and the amplitude of a carrier signal at the same time.

Simultaneous amplitude and phase modulation make it possible to achieve higher data transmission rates and thus better bandwidth efficiency. The mobile radio standards mentioned above envisage, for example, the use of quadrature phase shift keying (QPSK), eight phase shift keying (8-PSK), or quadrature amplitude modulation (QAM) as modulation types for the data transmission.

Depending on the selected application for the individual mobile radio standards, these high-quality modulation types are used not only for data transmission from a base station to a mobile communication appliance but also from the mobile communication appliance to the base station.

The modulation types which are used for modern mobile radio standards are particularly sensitive to possible distortion which is produced by various components in a transmission path.

A modulation can be performed using a vector modulation in which data to be transmitted is provided as symbols comprising an in-phase component and a quadrature component. FIG. 8A shows an exemplary constellation diagram of a symbol X which is represented by an in-phase component I and a quadrature component Q. The in-phase component I and the quadrature component Q are modulated using two carrier signals of the same frequency which comprise a phase shift of 90°.

FIG. 8B shows another representation of an exemplary symbol X which is coded with polar coordinates having an amplitude component A and a phase component $\phi$. A carrier signal is phase modulated depending on the phase component $\phi$. Then, an amplitude modulation can be performed with the phase modulated carrier signal depending on the amplitude component A.

Another way of modulating input data is an outphasing modulation. FIG. 8C shows a constellation diagram of an exemplary symbol vector X which is described by two signal vectors S1, S2 having the same amplitude but a different phase $\phi 1$, $\phi 2$. Compared to the polar modulation, a combination of a phase modulation and an amplitude modulation is replaced by a single phase modulation of each of two carrier signals of the same amplitude. The underlying principle can be explained using the addition theorem:

$$\cos(a+b)+\cos(a-b)=2\cos(a)\cos(b), \quad (1)$$

with $$S1=\cos(a+b) \text{ and } S2=\cos(a-b). \quad (2)$$

Assuming that $a=\omega t+\phi(t)$ and $b=\arccos(0.5*A(t))$, where $\omega$ is an angular frequency, $\phi(t)$ is a time dependent phase information, and A(t) is a time dependent amplitude information, it results:

$$S1+S2=A(t)\cos(\omega t+\phi(t)) \quad (3)$$

Thus, the phase information $\phi 1$ and $\phi 2$ of FIG. 8C can easily be derived to $$\phi 1=\phi(t)+\arccos(0.5*A(t)),$$

$$\phi 2=\phi(t)-\arccos(0.5*A(t)). \quad (4)$$

FIG. 9 shows an exemplary embodiment of a conventional transmitter arrangement to perform an outphasing modulation. The arrangement comprises a first and a second input 10, 20 to provide a first and a second phase information $\phi 1$, $\phi 2$. The arrangement further comprises a first loop comprising a first control device CD1 and a first controlled oscillator CO1 to generate a first oscillator signal depending on the first phase information $\phi 1$. Accordingly, a second loop comprises a second control device CD2 and a second controlled oscillator CO2 to generate a second oscillator signal depending on the second phase information $\phi 2$. The oscillator signals are provided to respective power amplifiers PA1, PA2 which comprise a common control input 350 to control a respective gain factor of the power amplifiers PA1, PA2. The output signals of the controlled oscillators CO1, CO2 correspond to the signal vectors S1, S2 of FIG. 8C.

The outputs of the power amplifiers PA1, PA2 are coupled to a summation element SU1 to combine the amplified oscillator signals. An output of the summation element SU1 is coupled to an antenna ANT.

A high accuracy of the phase modulation in the first and the second controlled oscillator CO1, CO2 can be desirable for certain applications, for example for certain mobile radio standards as GSM/EDGE or UMTS. To receive a desired output signal at the output of the summation element SU1, also the amplitude of the amplified oscillator signals should be the same. Therefore, a phase and/or an amplitude deviation between the two signal paths can be a critical factor for the transmitter arrangement.

To reduce a phase deviation, for example, the combined output signal at the output of the summation element SU1 can be demodulated using an I/Q-demodulator, thus generating respective feedback signals. Depending on a comparison of the fed back and demodulated signals to a desired in-phase and quadrature component, respectively, the generation of the two oscillator signals can be controlled. However, such arrangement needs an additional I/Q-demodulator.

BRIEF DESCRIPTION OF THE DRAWINGS

The invention is explained in detail below using exemplary embodiments with reference to the drawings, in which FIG. 7 is an exemplary embodiment of a signal processing method.

DETAILED DESCRIPTION OF THE INVENTION

Figure 1:
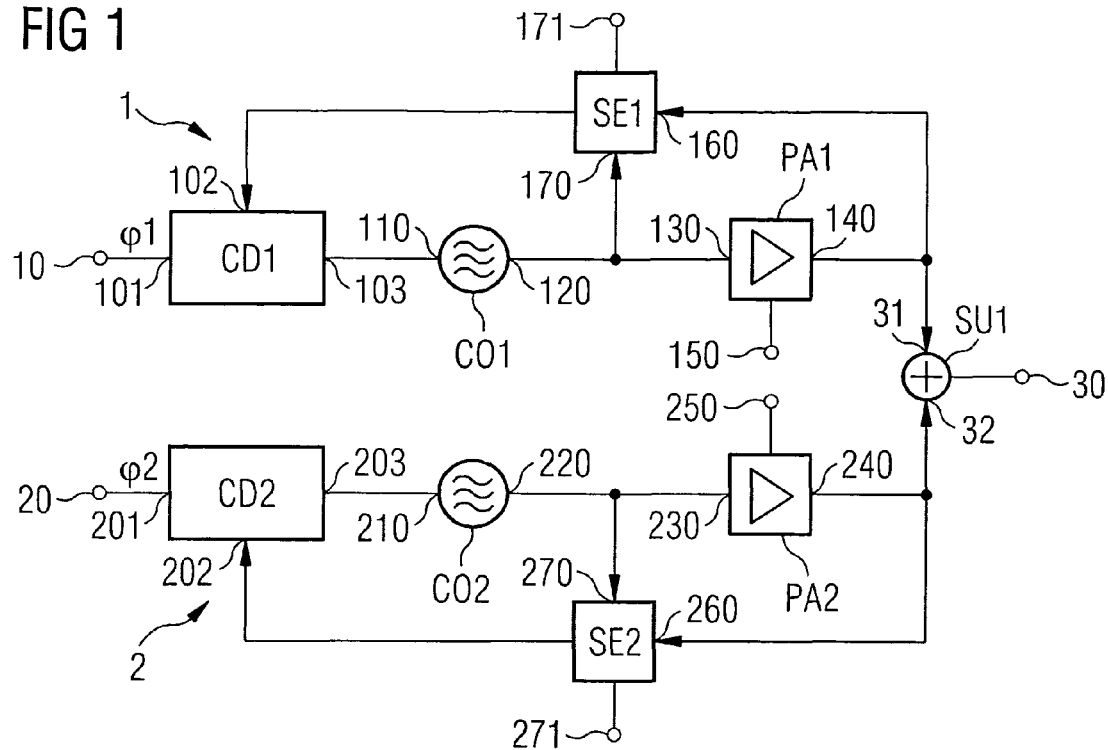
FIG. 1 is a first exemplary embodiment of a transmitter arrangement.

In the following description further aspects and embodiments of the present invention are summarized. In addition, reference is made to the accompanying drawings, which form a part hereof, and in which is shown by way of illustration, in which the invention may be practiced. The embodiments of the drawings present a summary in order to provide a better understanding of one or more aspects of the present invention. This summary is not an extensive overview of the invention and neither intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

FIG. 1 shows an exemplary embodiment of a transmitter arrangement which can be used for an outphasing modulation. The transmitter arrangement comprises a first and a second phase-locked loop (PLL) 1, 2 and a summation element SU1 with inputs 31, 32 coupled to respective outputs of the first and the second phase-locked loop 1, 2. An output of the summation element SU1 is coupled to an output 30 of the transmitter arrangement.

The first phase-locked loop 1 comprises a first signal input 10 to receive a first input signal representing a first phase information φ1. The input 10 is coupled to a first data input 101 of a first control device CD1. The first control device CD1 further comprises a feedback input 102 and a first control output 103 which is coupled to a first control input 110 of a first controlled oscillator CO1. The phase-locked loop 1 further comprises a first power amplifier PA1 comprising an input 130 coupled to a signal output 120 of the first controlled oscillator CO1. An output 140 of the first power amplifier PA1 is coupled to the first feedback input 102 via a first selection element SE1.

In one embodiment, the selection element SE1 comprises a first input 160 coupled to the output 140 of the power amplifier PA1 and a second input 170 coupled to the signal output 120 of the first controlled oscillator CO1. An output of the selection element SE1 is coupled to the first feedback input 102 of the first control device CD1.

The transmitter arrangement further comprises a second phase-locked loop 2 which is mainly a copy of the first phase-locked loop 1. To this end, the second phase-locked loop 2 comprises a second input 20 to receive a second input signal representing a second phase information φ2. A second control device CD2 comprises a second data input 201 coupled to the second input 20, a second feedback input 202 coupled to an output of a second selection element SE2 and a second control output 203 coupled to a second control input 210 of a second controlled oscillator CO2. A second signal output 220 of the second controlled oscillator CO2 is coupled to an input 230 of a second power amplifier PA2 and to an input 270 of the second selection element SE2. A further input 260 of the second selection element SE2 is coupled to the signal output 240 of the second power amplifier PA2.

The signal outputs 140, 240 of the first and the second power amplifier PA1, PA2, which form respective outputs of the first and the second phase-locked loop 1, 2, are coupled to respective inputs 31, 32 of the summation element SU1. In the transmitter arrangement, the first control device CD1 generates a first control signal as a function of a first feedback signal provided from the first selection unit SE1 and the first input signal provided at the first data input 101. Accordingly, the second control device CD2 generates a second control signal as a function of a second feedback signal provided by the second selection element SE2 and the second input signal provided at the second data input 201.

Figure 8A:
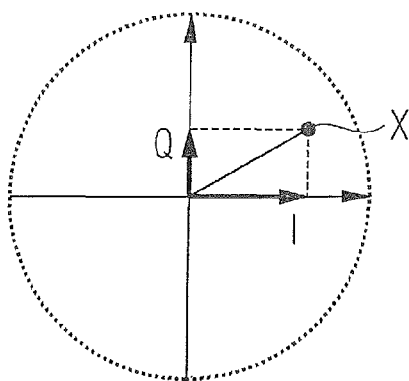
FIGS. 8A, 8B, and 8C are exemplary constellation diagrams for different modulation types.
Figure 8B:
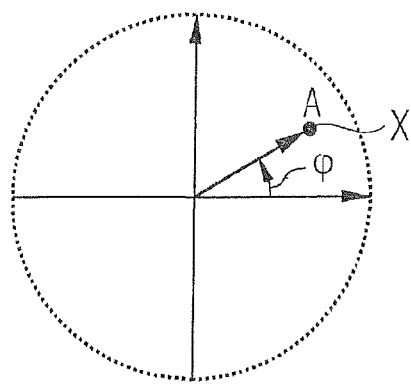
Figure 8C:
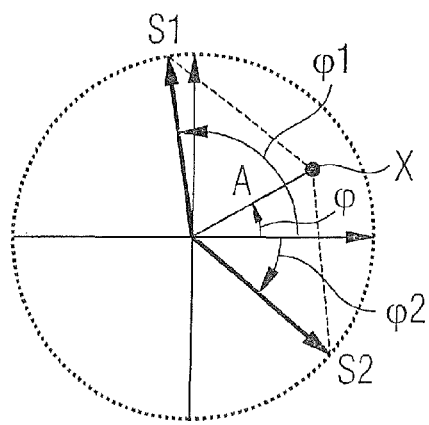
Figure 9:
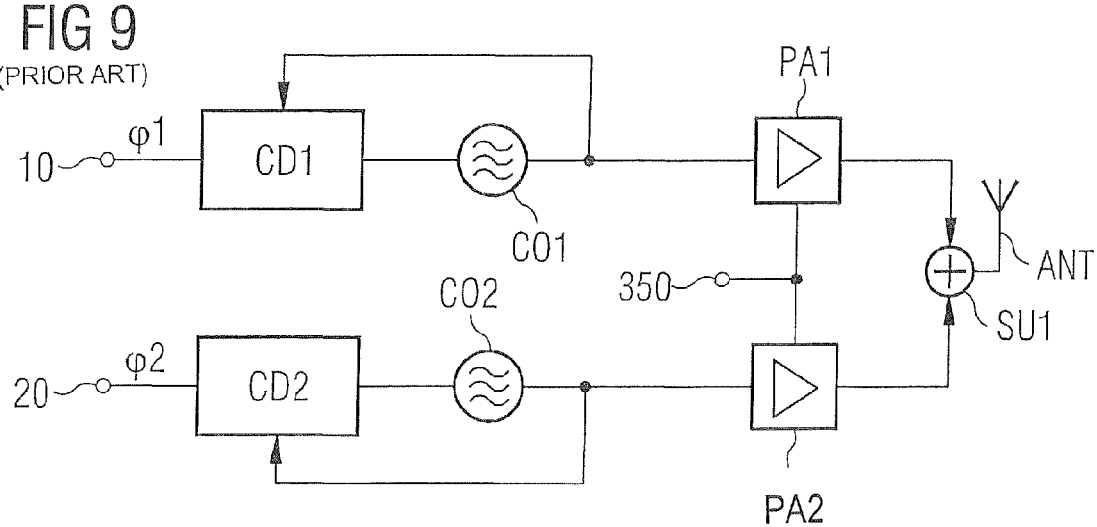
FIG. 9 is an embodiment of a conventional transmitter arrangement.

The first and the second input signal comprise the first and the second phase information φ1, φ2 which may be generated according to the outphasing principle described for FIG. 8C.

In one embodiment, depending on the first and the second control signal, respectively, the first and the second controlled oscillator CO1, CO2 generate a first and a second oscillator signal. The first and the second oscillator signal are phase modulated depending on the first and the second phase information φ1, φ2. The first and the second oscillator signals are amplified by the first and the second power amplifier PA1, PA2, respectively. The summation element SU1 combines the amplified first oscillator signal and the amplified second oscillator signal to an output signal which is provided to the signal output 30 of the transmitter arrangement.

The first feedback signal is derived from the amplified first oscillator signal via the first selection element SE1. The first feedback signal can further be derived directly from the first oscillator signal at the signal output 120 of the first controlled oscillator CO1 depending on a feedback control signal provided at a control input 171 of the first selection element SE1. For example, the first selection element can provide the amplified first oscillator signal or the unamplified first oscillator signal or a combination of the unamplified and the amplified first oscillator signal as the first feedback signal depending on the feedback control signal.

Accordingly, the second feedback signal is derived from the amplified second oscillator signal and from the unamplified second oscillator signal depending on the feedback control signal which is provided at the control input 271 of the second selection element SE2. Thus, the coupling of the first feedback input 102 and the first selection element SE1 forms a first feedback path, and the coupling of the second feedback input 202 and the second selection element SE2 forms a second feedback path.

In other words, the first feedback input 102 is coupled to the output 140 of the first power amplifier PA1 or to the signal output 120 of the first controlled oscillator CO1 depending on the feedback control signal and the second feedback input 202 is coupled to the output 240 of the second power amplifier PA2 or to the signal output 220 of the second control oscillator CO2 depending on the feedback control signal.

According to the principle of outphasing modulation, the amplified first and the amplified second oscillator signal should have the same amplitude. To this end, the first and the second power amplifier PA1, PA2 each comprise a power control input 150, 250 to receive a power control signal determining a respective gain factor of the power amplifiers PA1, PA2. Thus, an amplitude of the first amplified and the second amplified oscillator signal can be adjusted accordingly. Additionally, the first and the second power amplifier PA1, PA2 can be calibrated manually or by using a calibrating circuit to achieve a matching gain factor depending on the power control signal.

By coupling the feedback path of the phase control loop to the output of the power amplifier, a phase deviation generated by the controlled oscillator and the power amplifier can be detected in one embodiment. A respective control signal for the controlled oscillators CO1, CO2 can be adapted accordingly. Controlling of the controlled oscillators CO1, CO2 is performed independently from each other. A phase deviation between the respective phase of the amplified oscillator signal and the respective phase information $\phi 1$, $\phi 2$ can be reduced using the proposed transmitter arrangement compared to a conventional transmitter arrangement.

The feedback control signal controlling which signal is fed back to the control devices CD1, CD2 as a feedback signal can be dependent on the power control signal determining the amplitude of the amplified oscillator signals in one embodiment. For example, the amplified oscillator signals are fed back for higher amplitudes and the unamplified oscillator signals are fed back for lower amplitudes.

In one embodiment the controlled oscillators CO1, CO2 can each comprise a voltage controlled oscillator (VCO), that means an oscillator which is controlled by an analog control signal. In another embodiment, the controlled oscillators CO1, CO2 each comprise a digitally controlled oscillator (DCO). In this case, the control devices CD1, CD2 can comprise a digital phase detector and a digital loop filter to provide a digital control signal to the respective DCO. In other words, the first and the second phase-locked loop 1, 2 can be controlled digitally. The use of $\Sigma\Delta$-modulators to generate a digital control signal is apparent to those of ordinary skill in the art.

Figure 2:
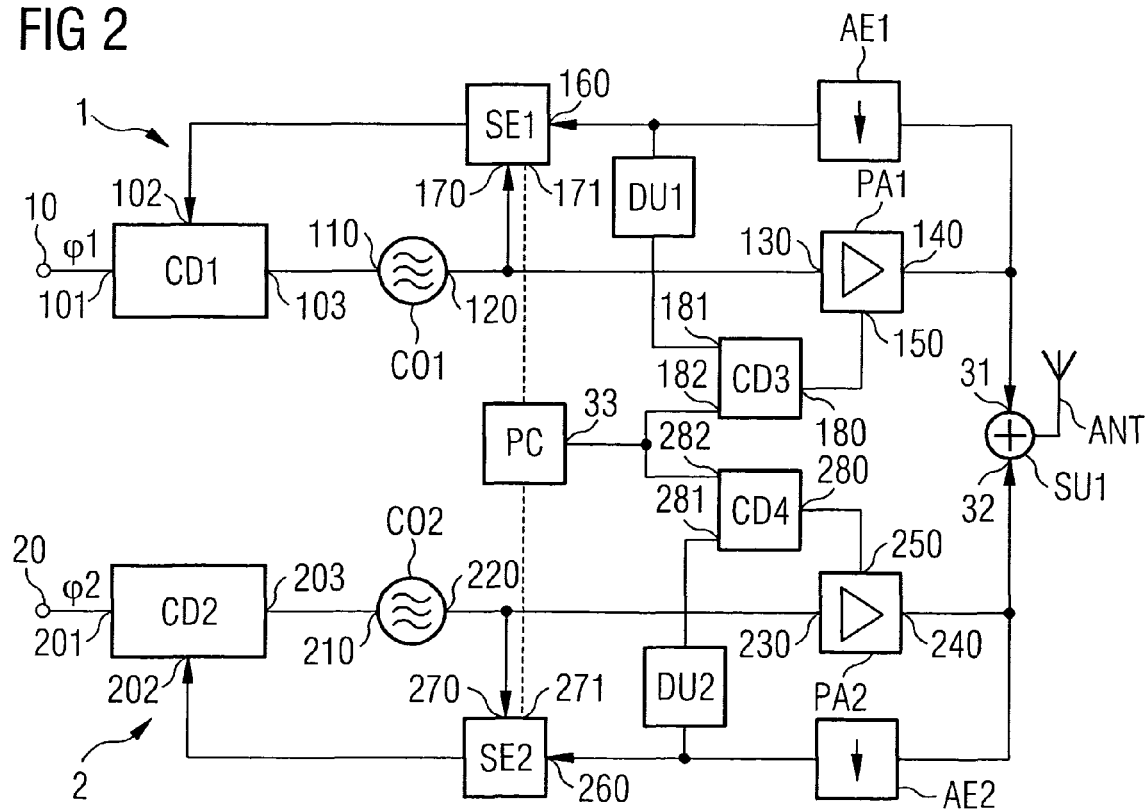
FIG. 2 is a second exemplary embodiment of a transmitter arrangement.

FIG. 2 shows another embodiment of a transmitter arrangement. In addition to the embodiment shown in FIG. 1, each signal path 1, 2 comprises two control loops. As described for FIG. 1, the first control loop controls the phase of the respective phase-modulated signal. The second control loop in the first signal path 1 is formed by a third control device CD3 comprising a reference input 182 to receive a reference value, a third feedback input 181 and a third control output 180 which is coupled to the first power control input 150 to provide the first power control signal. The third feedback input 181 is coupled to the output 140 of the first power amplifier PA1 via a first detection unit DU1 and an attenuation element AE1. The reference value for the third control device CD3 is received from an output 33 of a power control unit PC.

Accordingly, the second signal path 2 comprising the second phase-locked loop further comprises a second control loop which is formed by the fourth control device CD4 comprising a reference input 282 coupled to the control output 33 to receive the reference value, a fourth feedback input 281 and a fourth control output 280 which is coupled to the second power control input 250 of the second power amplifier PA2. The fourth feedback input 281 is coupled to the output 240 of the power amplifier PA2 via a second detection unit DU2 and a second attenuation element AE2.

The first and the second detection unit DU1, DU2 each detect an amplitude of the first and the second amplified oscillator signal, respectively, which are attenuated by the first and the second attenuation element AE1, AE2. The reference value provided by the power control unit PC represents a desired amplitude of the amplified oscillator signals or an output power of the power amplifiers PA1, PA2, respectively. Depending on the detected amplitude and the reference value, the first and the second power control signal are generated by the third and the fourth control device CD3, CD4. Thus, a respective gain factor of the first and the second power amplifier PA1, PA2 is adjusted as a function of the reference value and the measured output amplitude.

As the amplitude of the phase modulated output signals of the first and the second phase-locked loop 1, 2 are controlled by the third and the fourth control device CD3, CD4, amplitude deviations between the first and the second phase-locked loop 1, 2 can be reduced. Furthermore, a desired output power of the transmitter arrangement can be controlled by the single reference value provided from the power control unit PC.

In some mobile radio standards like UMTS or GSM/EDGE, the output power of an output signal provided to an antenna ANT has to be increased from a low power to a high power for certain transmitting methods. This increasing can also be called power ramping. In some cases, also a controlled decreasing of the output power is a desired function. To this end, the reference value can be adjusted by the power control unit PC over time depending on the desired output power function.

The amplified output signals of the first and the second power amplifier PA1, PA2 can be attenuated by the first and the second attenuation element AE1, AE2 if the respective amplitude was too high for the amplitude detection units DU1, DU2. The power control unit PC also controls the selection elements SE1, SE2 by the feedback control signal via their inputs 171, 271. If the reference value provided by the power control unit PC represents a low output power, an amplitude of the fed back amplified signals may be too small for a correct phase determination within the first and the second control device CD1, CD2. In this case, it may be desirable to directly feed back the output signals of the controlled oscillators CO1, CO2, for example, at the beginning of an increasing power ramp.

For higher output powers, a phase detection can be performed with a fed back amplified oscillator signal. For switching between the unamplified and the amplified oscillator signal, it can be desirable to derive the first and the second feedback signal by fading from one signal to the other. This can reduce possible phase steps to be detected when performing a hard switching between the two signals.

Figure 3:
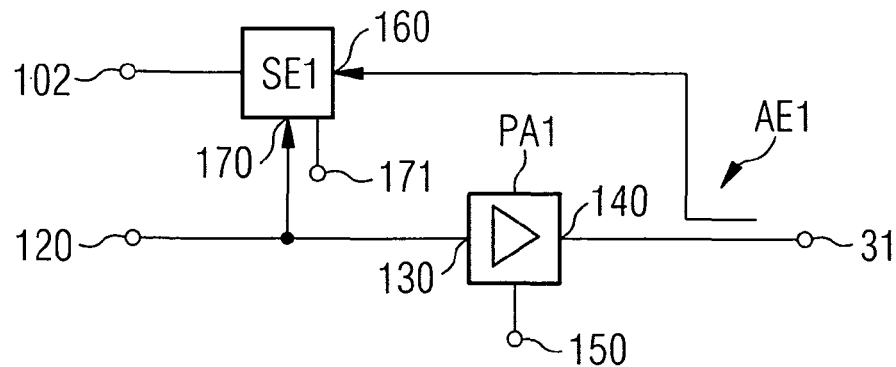
FIG. 3 is an exemplary embodiment of a first detail of a transmitter arrangement.

FIG. 3 shows an exemplary detail of one embodiment of a transmitter arrangement. The first feedback input 102 can be coupled to the output 140 of the first power amplifier PA1 via a directional coupler which forms the first attenuation element AE1. In this embodiment, a directional coupler is coupled to the first selection element SE1. It is evident that also the second power amplifier PA2 can comprise a directional coupler which forms the second attenuation element AE2 in one embodiment.

Figure 4:
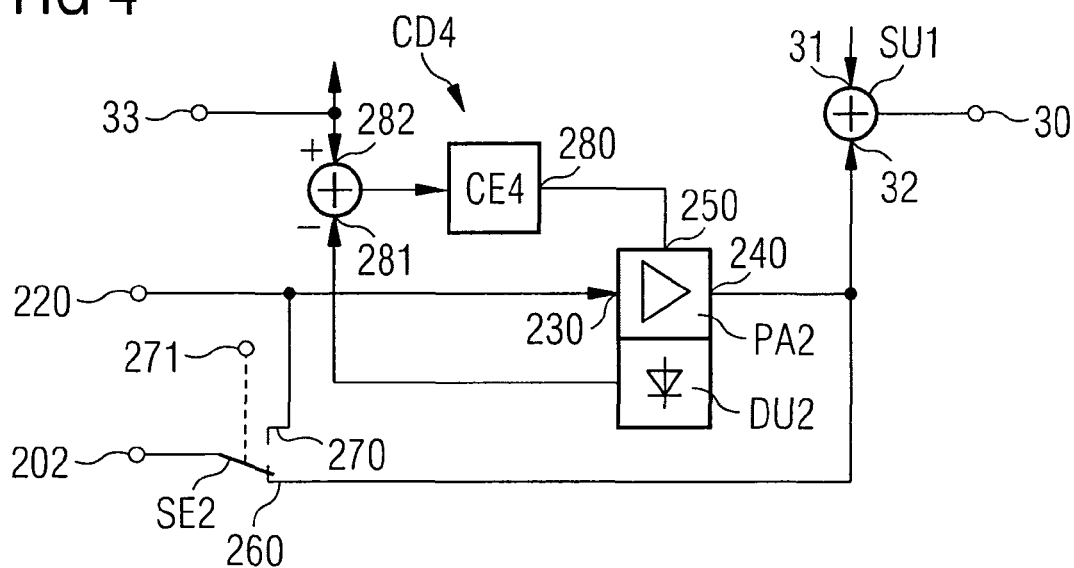
FIG. 4 is an exemplary embodiment of a second detail of a transmitter arrangement.

FIG. 4 shows another exemplary detail of an embodiment of a transmitter arrangement. The second selection element SE2 is formed by a switch comprising the inputs 260, 270 and an output which is coupled to the second feedback input 202. The switch is controlled via the feedback control signal at the control input 271.

In this embodiment, the second detection unit DU2, which, for example, is formed as a diode based amplitude detector, is combined with the second power amplifier PA2. The fourth control device CD4 comprises a summation element having the positive reference input 282 and the negative fourth feedback input 281 and a control element CE4 which is coupled to the output of the summation element. An output of the control element CE4 forms the fourth control output 280 which is coupled to the second power control input 250.

In one embodiment, when integrating an embodiment of a transmitter arrangement as an integrated circuit, the control devices and the power amplifier can be integrated on the same chip, on different parts of a chip, or on different chips. In the latter case, it may be desirable to integrate the detection unit together with the respective power amplifier and feed back the low frequency detection signals of the detection units to the third and the fourth control devices instead of feeding back the respective oscillator signals.

Figure 5:
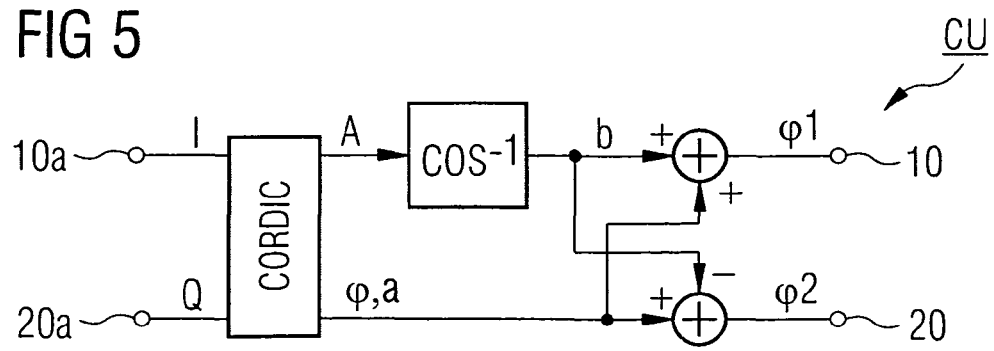
FIG. 5 is an exemplary embodiment of a conversion unit.

In one embodiment the transmitter arrangement can comprise a conversion unit to generate the first and the second input signal as a function of input data provided. FIG. 5 shows an exemplary embodiment of a conversion unit CU which comprises a signal input 10A, 20A and a first and a second data output which form or are coupled to the first and the second data input 10, 20. The conversion unit CU comprises a coordinate rotation digital computer (CORDIC) which is coupled to the data input 10A, 20A to receive an in-phase component I and a quadrature component Q. The CORDIC derives an amplitude component A and a phase component φ from the in-phase and the quadrature component I, Q. The amplitude component A is provided to an inverted cosine element to derive the value b used in equation (4) by performing the arccosine function. The value a equals the phase component φ. The values a, b are provided to two summation elements to derive the first and the second input signal corresponding to phase information φ1, φ2 according to equation (4) which are used to control the first and the second phase-locked loop 1, 2. Thus the values a, b are added to generate the first phase information φ1. Accordingly, the value b is subtracted from the value a to generate the second phase information φ2.

Figure 6:
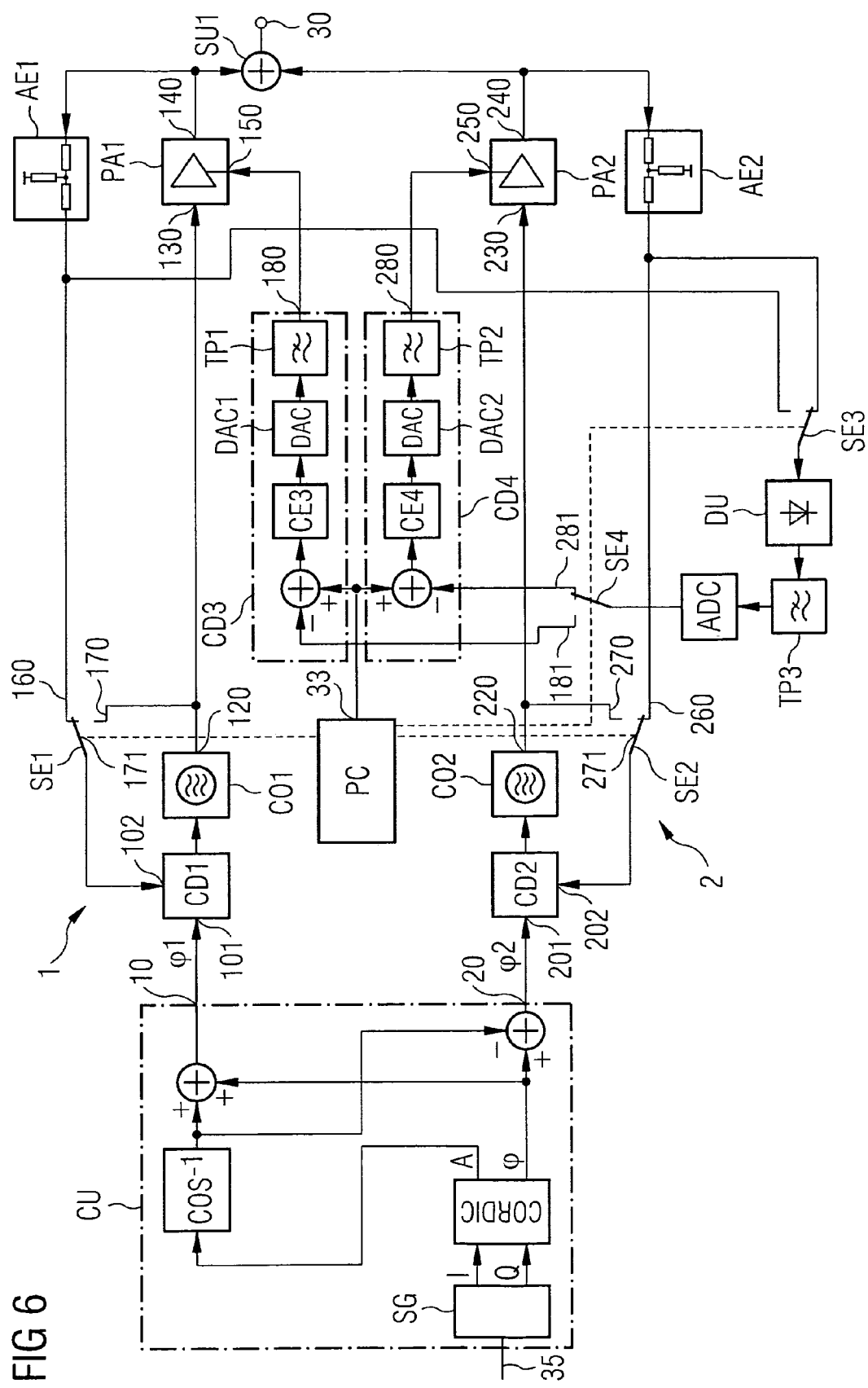
FIG. 6 is a third exemplary embodiment of a transmitter arrangement.

FIG. 6 shows another embodiment of a transmitter arrangement. It comprises the conversion unit CU to generate the first and the second phase information φ1, φ2 as a function of input data provided at an input 35 of the conversion unit CU. To this end, the conversion unit CU comprises a signal generator SG to generate the in-phase and the quadrature component I, Q from the input data. The input data can be received as digital signals, for example according to the digRF standard. In another embodiment, the input data are received as an analog signal which is converted to a digital signal and the in-phase and the quadrature component I, Q by the signal generator SG.

In this embodiment of a transmitter arrangement, the first and the second selection element SE1, SE2 comprise switches which are controlled by the feedback control signal provided from the power control unit PC.

The transmitter arrangement comprises a single detection unit DU with a low pass filter TP3 and an analog to digital converter ADC coupled to the output of the detection unit DU. The input of the detection unit DU can be coupled to the output of the first attenuation element AE1 or to the output of the second attenuation element AE2 by a further selection element SE3 which is controlled by the power control unit PC via a detection control signal.

Accordingly, the output of the analog/digital converter ADC can be coupled to the third or to the fourth feedback input 181, 281 of the third and the fourth control device CD3, CD4 via a further selection element SE4. The third and the fourth selection element SE3, SE4 are controlled concurrently by the power control unit PC such that in each case, the third feedback input 181 is coupled to the output 140 of the first power amplifier PA1 or the fourth feedback input 281 is coupled to the output 240 of the second power amplifier PA2. Therefore, the third and the fourth selection element SE3, SE4 can receive the same detection control signal.

The measured or detected amplitude of the respective phase modulated oscillator signal is provided to the third and the fourth control device CD3, CD4 as a digital value. In this case, also the reference value provided by the power control unit PC is a digital value. The third and the fourth control device CD3, CD4 each comprise a control element CE3, CE4 to generate a digital power control signal which is converted to an analog power control signal and filtered via the digital/analog converters DAC1, DAC2 and the low pass filters TP1, TP2.

In an alternative embodiment, the power amplifiers PA1, PA2 can be controlled by a digital power control signal. In this case, the power control inputs 150, 250 can be directly coupled to the outputs of the third and the fourth control element CE3, CE4, respectively. In one embodiment it is desirable to provide similar components for the first and the second phase-locked loop 1, 2 to achieve as little mismatch between the phase-locked loops as possible. Thus, the proposed transmitter arrangement makes it possible to reduce both an amplitude deviation and a phase deviation of the amplified phase modulated oscillator signals compared to a desired amplitude represented by the reference value and the respective phase information φ1, φ2.

In one embodiment the transmitter arrangement can be used in a transmitter path of a mobile communication appliance which can be employed in different mobile communication standards. For example, a single transmitter arrangement according to the proposed principle can be used for both the UMTS standard and the GSM/EDGE standard. In other words, the proposed transmitter arrangement can be used for multi-mode applications.

In one embodiment the power amplifiers PA1, PA2 can be operated in a saturated mode of operation. Therefore, the efficiency of the power amplifiers PA1, PA2 is high, which increases the achievable output power of a mobile communication appliance. The proposed transmitter arrangement can also be used in a base station for mobile communication services. In this case, a high efficiency of the power amplifiers makes it possible to reduce the number of base stations in low-populated areas. Also the bandwidth requirement of the proposed transmitter arrangement is small compared to a conventional transmitter arrangement.

FIG. 7 shows an exemplary embodiment of a signal processing method. While the method and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

At S1 input signals are provided comprising a first and a second phase information φ1, φ2 which may be generated according to the outphasing principle described for FIG. 8C in one embodiment. At S2, phase control signals are generated as a function of each of the first and the second phase information φ1, φ2 and respective feedback signals. The phase control signals are used to generate a first and a second oscillator signal at S3, for example with controlled oscillators CO1, CO2. The oscillator signals can be phase modulated radio frequency signals in one embodiment.

Furthermore at S2 a first and a second power control signal are derived as a function of a reference value and feedback signals. After generating the oscillator signals at S3, the first and the second oscillator signal are each amplified at S4, depending on the respective power control signals in one embodiment.

At S5 the feedback signals are derived from the amplified oscillator signals. For example, in one embodiment the amplified oscillator signals are attenuated and fed back to compare a phase of the feedback signal with the given phase information φ1, φ2 respectively for deriving the phase control signals. The power control signals can be derived by comparing an amplitude of the feedback signals and the reference value. For example, the power control signals determine a respective gain factor of power amplifiers PA1, PA2 for amplifying the oscillator signals.

The generating and amplifying of the oscillator signals and the deriving of the feedback signals are performed in a loop in one embodiment. Thus it can be continued at S2.

An output signal of the signal processing method is generated by combining the amplified oscillator signals at S6 in one embodiment.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A transmitter arrangement, comprising:
a first and a second controlled oscillator, each comprising a control input and a signal output;
a first control device comprising a first data input, a first feedback input and a first control output which is coupled to the control input of the first controlled oscillator;
a second control device comprising a second data input, a second feedback input and a second control output which is coupled to the control input of the second controlled oscillator;
a first power amplifier comprising an input coupled to the signal output of the first controlled oscillator, an output coupled to the feedback input of the first control device and a first power control input to adjust a gain factor of the first power amplifier;
a second power amplifier comprising an input coupled to the signal output of the second controlled oscillator, an output coupled to the feedback input of the second control device and a second power control input to adjust a gain factor of the second power amplifier; and
a summation element which on its input side is coupled to the output of the first and the second power amplifier and which comprises an output coupled to a signal output of the transmitter arrangement;
wherein the first feedback input is selectively coupled to the output of the first power amplifier or to the signal output of the first controlled oscillator depending on a feedback control signal, and wherein the second feedback input is selectively coupled to the output of the second power amplifier or to the signal output of the second controlled oscillator depending on the feedback control signal.

2. The transmitter arrangement of claim 1, further comprising:
a third control device comprising a reference input to receive a reference value, a third feedback input which is coupled to the output of the first power amplifier and a third control output which is coupled to the first power control input of the first power amplifier; and
a fourth control device comprising a reference input to receive the reference value, a fourth feedback input which is coupled to the output of the second power amplifier and a fourth control output which is coupled to the second power control input of the second power amplifier.

3. The transmitter arrangement of claim 2, further comprising a first detection unit which couples the third feedback input of the third control device to the first power amplifier and a second detection unit which couples the fourth feedback input of the fourth control device to the second power amplifier.

4. The transmitter arrangement of claim 2, further comprising a detection unit which is selectively coupled between the third feedback input and the first power amplifier or between the fourth feedback input and the second power amplifier depending on a detection control signal.

5. The transmitter arrangement of claim 1, wherein the first and the second power amplifier each comprise an attenuation element coupled to the output of the respective power amplifier.

6. The transmitter arrangement of claim 1, wherein at least one of the first and the second controlled oscillator is controlled digitally.

7. The transmitter arrangement of claim 1, further comprising a conversion unit which comprises a signal input and a first and a second data output coupled to the first and the second data input, the conversion unit generating a first and a second input signal, each representing a phase information to be provided at the first and the second data output as a function of input data received at the signal input.

8. A transmitter arrangement, comprising:
a first controlled oscillator to generate a first oscillator signal depending on a first control signal;
a second controlled oscillator to generate a second oscillator signal depending on a second control signal;
a first power amplifier to amplify the first oscillator signal;
a second power amplifier to amplify the second oscillator signal;
a summation element to combine the amplified first oscillator signal and the amplified second oscillator signal to an output signal;
a first control device to generate the first control signal as a function of a first input signal and a first feedback signal, wherein a first feedback path to provide the first feedback signal is coupled to an output of the first power amplifier; and
a second control device to generate the second control signal as a function of a second input signal and a second feedback signal, wherein a second feedback path to provide the second feedback signal is coupled to an output of the second power amplifier;
wherein the first feedback path is selectively coupled to the output of the first power amplifier or to a signal output of the first controlled oscillator depending on a feedback control signal.

9. The transmitter arrangement of claim 8, further comprising:
a third control device to generate a first power control signal determining a gain factor of the first power amplifier as a function of a reference value and an amplitude of the amplified first oscillator signal; and a fourth control device to generate a second power control signal determining a gain factor of the second power amplifier as a function of the reference value and an amplitude of the amplified second oscillator signal.

10. The transmitter arrangement of claim 9, further comprising:

a first detection unit coupled to the third control device and to the first power amplifier to measure the amplitude of the amplified first oscillator signal and provide the measured amplitude to the third control device; and a second detection unit coupled to the fourth control device and to the second power amplifier to measure the amplitude of the amplified second oscillator signal and provide the measured amplitude to the fourth control device.

11. The transmitter arrangement of claim 9, further comprising a detection unit which is selectively coupled between the third control device and the first power amplifier to measure the amplitude of the amplified first oscillator signal or between the fourth control device and the second power amplifier to measure the amplitude of the amplified second oscillator signal depending on a detection control signal.

12. The transmitter arrangement of claim 8, wherein the second feedback path is selectively coupled to the output of the second power amplifier or to a signal output of the second controlled oscillator depending on the feedback control signal.

13. The transmitter arrangement of claim 8, wherein the first and the second power amplifier each comprise an attenuation element coupled to the output of the respective power amplifier.

14. The transmitter arrangement of claim 8, wherein the first and the second control signal are provided as digital control signals.

15. The transmitter arrangement of claim 8, further comprising a conversion unit to generate the first and the second input signal each representing a phase information as a function of input data provided thereto.

16. A transmitter arrangement, comprising:

a first phase locked loop comprising a first controlled oscillator to generate a first oscillator signal to be amplified and a first power amplifier, the first phase locked loop to generate a first amplified oscillator signal depending on a first input signal representing a first phase information, wherein a first feedback signal for the first phase locked loop is selectively derived from the first amplified oscillator signal or the first oscillator signal, depending on a feedback control signal;

a second phase locked loop comprising a first controlled oscillator to generate a second oscillator signal to be amplified and a second power amplifier, the second phase locked loop to generate a second amplified oscillator signal depending on a second input signal representing a second phase information, wherein a second feedback signal for the second phase locked loop is selectively derived from the second amplified oscillator signal or the second oscillator signal, depending on the feedback control signal;

a summation element to combine the amplified first oscillator signal and the amplified second oscillator signal to an output signal.

17. The transmitter arrangement of claim 16, wherein each of the first and the second phase locked loops comprise a control device to adjust a gain factor of the respective power amplifier as a function of a reference value and the respective amplified oscillator signal.

18. The transmitter arrangement of claim 16, wherein the first and the second phase locked loop are controlled digitally.

19. The transmitter arrangement of claim 16, further comprising a conversion unit to generate the first and the second input signal as a function of input data provided thereto.

20. A signal processing method, comprising:

generating a first control signal as a function of a first feedback signal and a first input signal;

generating a second control signal as a function of a second feedback signal and a second input signal;

generating a first oscillator signal depending on the first control signal;

generating a second oscillator signal depending on the second control signal;

amplifying the first oscillator signal and the second oscillator signal;

combining the amplified first oscillator signal and the amplified second oscillator signal to an output signal;

selectively deriving the first feedback signal from the amplified first oscillator signal or the first oscillator signal depending on a feedback control signal; and deriving the second feedback signal from the amplified second oscillator signal.

21. The method of claim 20, wherein amplifying the first and the second oscillator signal depends on a first and a second power control signal determining a respective gain factor, and wherein the first power control signal is derived as a function of a reference value and the first amplified oscillator signal and the second power control signal is derived as a function of the reference value and the second amplified oscillator signal.

22. The method of claim 21, wherein deriving the first and the second power control signal comprises measuring a respective amplitude of the first and the second amplified oscillator signal.

23. The method of claim 20, wherein the second feedback signal is further selectively derived from the second oscillator signal depending on the feedback control signal.

24. The method of claim 20, wherein deriving the first and the second feedback signal comprises attenuating the first and the second amplified oscillator signal respectively.

25. The method of claim 20, wherein the first and the second control signals are generated as digital signals.

26. The method of claim 20, further comprising generating the first and the second input signals as a function of input data provided, the first and the second input signals each representing a phase information.

27. A signal processing method, comprising:

generating a first phase modulated signal as a function of a first feedback signal and a first input signal which represents a first phase information;

generating a second phase modulated signal as a function of a second feedback signal and a second input signal which represents a second phase information;

amplifying the first phase modulated signal depending on a first power control signal;

amplifying the second phase modulated signal depending on a second power control signal;

generating an output signal by summing up the amplified first phase modulated signal and the amplified second phase modulated signal;

selectively deriving the first feedback signal from the amplified first phase modulated signal or the first phase modulated signal depending on a feedback control signal; and deriving the second feedback signal from the amplified second phase modulated signal.

28. The method of claim 27, wherein the first power control signal is derived as a function of a reference value and an amplitude of the amplified first phase modulated signal, and the second power control signal is derived as a function of the reference value and an amplitude of the amplified second phase modulated signal.

29. The method of claim 27, wherein the second feedback signal is further derived from the second phase modulated signal depending on the feedback control signal.

30. The method of claim 27, wherein deriving the first and the second feedback signal comprises attenuating the first and the second amplified phase modulated signal respectively.

* * * * *